United States Patent
Wu et al.

(10) Patent No.: US 9,461,623 B2
(45) Date of Patent: Oct. 4, 2016

(54) METHOD AND CIRCUIT FOR TEMPERATURE DEPENDENCE REDUCTION OF A RC CLOCK CIRCUIT

(71) Applicant: MACRONIX International Co., Ltd., Hsinchu (TW)

(72) Inventors: Hsien-Hung Wu, Hsinchu (TW); Yi-Ching Liu, Hsinchu (TW); Shin-Jang Shen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 49 days.

(21) Appl. No.: 14/279,004

(22) Filed: May 15, 2014

(65) Prior Publication Data

US 2015/0333736 A1 Nov. 19, 2015

(51) Int. Cl.
| | |
|---|---|
| *H03K 3/011* | (2006.01) |
| *H03K 4/48* | (2006.01) |
| *H03B 5/12* | (2006.01) |
| *H03K 3/0231* | (2006.01) |

(52) U.S. Cl.
CPC .............. *H03K 3/011* (2013.01); *H03B 5/1265* (2013.01); *H03K 3/0231* (2013.01); *H03K 4/48* (2013.01)

(58) Field of Classification Search
CPC .................. H03K 4/48–4/725; H03K 3/0231; H03K 3/011; H03B 5/1265
See application file for complete search history.

(56) References Cited

U.S. PATENT DOCUMENTS

| | | | | |
|---|---|---|---|---|
| 5,982,241 A * | 11/1999 | Nguyen et al. | | 331/49 |
| 6,157,270 A * | 12/2000 | Tso | | 331/176 |
| 6,825,735 B2 * | 11/2004 | Chung | | H03B 5/04 331/135 |
| 7,129,798 B2 * | 10/2006 | Aoyama | | H03K 3/011 331/135 |
| 7,227,422 B2 | 6/2007 | Yarborough, Jr. | | |
| 7,251,158 B2 | 7/2007 | Hsia et al. | | |
| 7,385,453 B2 * | 6/2008 | Nervegna | | H03K 3/011 331/111 |
| 7,432,771 B2 * | 10/2008 | Chui | | 331/144 |
| 7,598,822 B2 * | 10/2009 | Rajagopal | | H03K 3/0231 331/111 |
| 7,654,736 B1 * | 2/2010 | Walker | | 374/176 |
| 7,719,371 B2 * | 5/2010 | Pernia et al. | | 331/78 |
| 7,843,279 B2 * | 11/2010 | Chou | | H03B 5/24 331/111 |
| 8,058,941 B2 * | 11/2011 | Kurogo et al. | | 331/158 |
| 8,093,958 B2 * | 1/2012 | O'Day | | H03L 1/02 331/117 R |
| 8,203,393 B1 * | 6/2012 | Leon | | H03K 3/011 331/176 |
| 8,212,624 B2 * | 7/2012 | Tokunaga | | H03K 4/501 327/131 |
| 8,493,114 B2 * | 7/2013 | Cho | | H03L 1/022 327/147 |
| 8,497,741 B2 | 7/2013 | Pedersen et al. | | |
| 8,878,621 B2 * | 11/2014 | Matsuzaki et al. | | 331/176 |
| 8,988,157 B2 * | 3/2015 | Tokairin | | 331/111 |
| 9,197,263 B2 * | 11/2015 | Onishi | | H04B 1/10 |
| 9,209,814 B2 * | 12/2015 | Matsuo | | H03K 3/0231 |
| 9,231,519 B2 * | 1/2016 | Wei | | H03B 5/04 |
| 2012/0249114 A1 * | 10/2012 | Sako et al. | | 323/312 |
| 2012/0319793 A1 * | 12/2012 | Iwasa | | H03K 3/0231 331/176 |
| 2013/0176082 A1 * | 7/2013 | Ishikawa | | 331/36 C |
| 2014/0218123 A1 * | 8/2014 | Wei et al. | | 331/176 |

\* cited by examiner

*Primary Examiner* — Thomas J Hiltunen
(74) *Attorney, Agent, or Firm* — J.C. Patents (57) ABSTRACT

A method and a circuit for generating a clock signal from a clock integrated circuit are introduced herein. A compensation voltage is generated according to a temperature coefficient of a resistor and a clock period of a clock circuit, where the compensation voltage is resistor-corner independent. The clock period of the clock circuit is determined by the resistor and at least one capacitor of the clock circuit. The temperature dependence of the clock period of the clock circuit is reduced according to the compensation voltage.

20 Claims, 6 Drawing Sheets

METHOD AND CIRCUIT FOR TEMPERATURE DEPENDENCE REDUCTION OF A RC CLOCK CIRCUIT

BACKGROUND OF THE INVENTION

1. Field of the Invention

The invention generally relates to a method and a circuit for reducing temperature dependence, in particular, to a method and a circuit for generating a clock signal from a clock integrated circuit for reducing temperature dependence of a clock circuit.

2. Description of Related Art

Figure 1A:
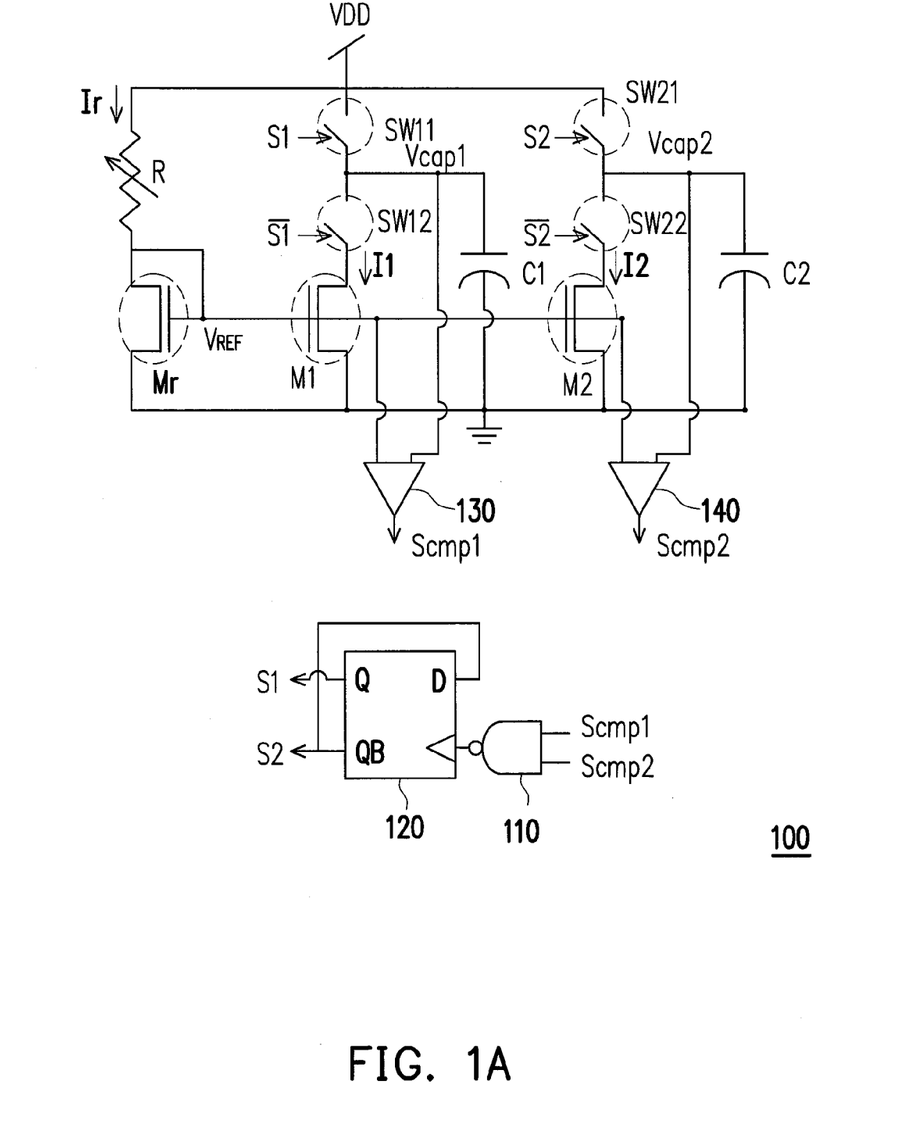
FIG. 1A is a circuit schematically illustrating an example RC clock circuit.

A RC clock circuit may be applied to various integrated circuits for providing a required clock signal. It can be highly integrated with other on-chip components and generally require no external components. FIG. 1A is a circuit diagram illustrating an example of a RC clock circuit 100. In the RC clock circuit 100, a clock trimming resistor R controls a current Ir flowing through a transistor Mr. Transistors M1, M2, and Mr are substantially the same so as to form current mirrors to equalize currents I1, I2, and Ir. The reference voltage Vref is a bias voltage of transistors M1, M2, and Mr and is also used to control alternating charging and discharging of capacitors C1 and C2. Capacitors C1 and C2 have a same capacitance C. A switching stage includes a pair of comparators 130 and 140, a NAND gate 110, a D flip-flop 120, and four switches SW11, SW12, SW21, and SW22. The Comparator 130 compares the voltage Vcap1 of the capacitor C1 with the reference voltage Vref and generates a signal Scmp1 accordingly and the signal Scmp1 is then sent to the NAND gate 110. For example, if the voltage Vcap1 is higher than the reference voltage Vref, the signal Scmp1 is at a high level, otherwise the signal Scmp1 is at a low level. The comparator 140 compares the voltage Vcap2 of the capacitor C2 with the reference voltage Vref and generates a signal Scmp2 accordingly and the signal Scmp2 is then sent to the NAND gate 110. For example, if the voltage Vcap2 is higher than the reference voltage Vref, the signal Scmp2 is at a high level, otherwise the signal Scmp2 is at a low level. The signal S1 output from the D flip-flop 120 is used to enable or disable switches SW11 and SW12. For example, if the signal S1 is at a high level, the switch SW11 is enabled and the switch SW12 is disabled, otherwise the switch SW11 is disabled and the switch SW12 is enabled. The signal S2 output from the D flip-flop 120 is used to enable or disable switches SW21 and SW22. For example, if the signal S2 is at a high level, the switch SW21 is enabled and the switch SW22 is disabled, otherwise the switch SW21 is disabled and the switch SW22 is enabled.

Figure 1B:
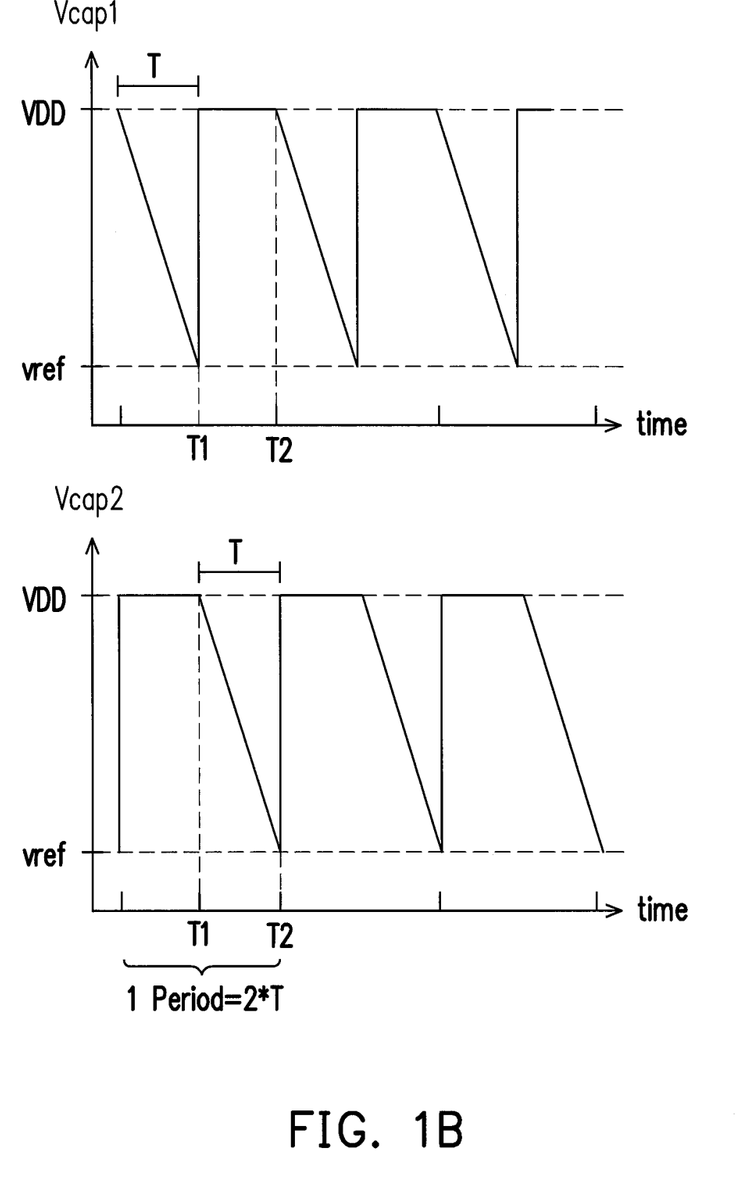
FIG. 1B is a timing diagram illustrating the timing of alternating charge and discharge of capacitors C1 and C2 of FIG. 1A.

FIG. 1B is a timing diagram illustrating timing of alternating charging and discharging of capacitors C1 and C2 of FIG. 1A. Referring to FIG. 1A and FIG. 1B, it is assumed that, at time of T1 in FIG. 1B, the signal S1 is at a high level and the signal S2 is at a low level, the capacitor C1 is charged to VDD (Vcap1=VDD) immediately for turning on the switch SW11 and turning off the switch SW12, and the capacitor C2 is starting to be discharged from VDD to Vref according to the discharge current I2 for turning off the switch SW21 and turning on the switch SW22. Before the voltage Vcap2 is discharged to Vref, both of the signals Scmp1 and Scmp2 output from comparators 130, 140 are kept high because the voltages Vcap1 and Vcap2 are both higher than Vref, such that no signal transition on the clock input end of the D flip-flop 120, and the signal S1 and the signal S2 are maintained their previous voltage levels. Till the voltage Vcap2 on the capacitor C2 is discharged to Vref (at time of T2 in FIG. 1B), the signal Scmp2 is changed from a high level to a low level and a rising edge occurs on the clock input end of the D flip-flop 120, such that the signal S1 is changed to a low level and the signal S2 is changed to a high level, therefore the capacitor C2 is charged to VDD (Vcap2=VDD) immediately for turning on the switch SW21 and turning off the switch SW22, and the capacitor C1 is starting to be discharged from VDD to Vref according to the discharge current I1 for turning off the switch SW11 and turning on the switch SW12. In this manner, the switching stage alternately charges and discharges the capacitors C1 and C2 between VDD and Vref.

The rate of change of the voltages on the capacitors C1 and C2 between VDD and Vref is referred to one RC time constant T as shown in FIG. 1B and is dominated by the resistance value of the clock trimming resistor R, that is because the transistors M1, M2, and M3 form current mirrors. Referring to FIG. 1A again, the voltage drop ΔV on R is (VDD−Vref) which is equal to the voltage change on the capacitors C1 and C2 while discharging as shown in FIG. 1B, and the discharging current (I1=I2=Iref) can be calculated by ΔV and R, i.e., ΔV/R. Therefore, one RC time constant T can be expressed as below:

$$T(\Delta V/R) = C \cdot \Delta V \qquad (1)$$

$$T = C \cdot R \qquad (2)$$

The clock period of the RC clock circuit equals to two RC time constant (2T) as shown in FIG. 1B. Because the clock period of the RC clock circuit is dominated by R, any variance that occurs on R influences the precision of the clock period. In order to overcome process variation on the clock trimming resistor R, the resistance of the clock trimming resistor R is commonly trimmed to a nominal value after fabrication. However if the clock trimming resistor R is temperature dependent, it could not be adjusted by resistance trimming, such that the clock period of the RC clock circuit drifts accordingly.

SUMMARY OF THE INVENTION

Accordingly, the invention is directed to provide a method and a circuit for generating a clock signal from a clock integrated circuit to reduce temperature dependence of a clock circuit.

The method for generating a clock signal from a clock integrated circuit is described as below. A compensation voltage is calculated according to a temperature coefficient of a resistor of the clock circuit, where the compensation voltage is resistor-corner independent. The temperature dependence of a clock period of the clock circuit is reduced according to the compensation voltage. The clock period of the clock circuit is determined by the resistor and at least one capacitor of the clock circuit.

In an embodiment of the invention, the compensation voltage is calculated according to the following formula.

$$Vc = \Delta V \cdot TC \cdot \Delta t$$

wherein ΔV is a voltage drop on the resistor based on a reference temperature, TC is the temperature coefficient of the clock trimming resistor, and Δt is a temperature difference between a temperature and the reference temperature.

In an embodiment of the invention, the method further comprising compensating a voltage change on the at least one capacitor of the clock circuit according to the compensation voltage when the at least one capacitor discharges. For details, the voltage change on the at least one capacitor is subtracted by the compensation voltage when the at least one capacitor discharges, or a threshold voltage is generated by adding the compensation voltage with a reference voltage, where the threshold voltage is used to control the alternating charge or discharge of the at least one capacitor after compensation, and the reference voltage is used to control the alternating charge or discharge of the at least one capacitor before compensation.

The invention also provides a circuit for generating a clock signal from a clock integrated circuit.

The circuit for generating a clock signal from a clock integrated circuit comprises a voltage generator, the voltage generator receives a reference voltage from the RC clock circuit and generates a threshold voltage to control the alternating charge or discharge of at least one capacitor of the clock circuit, where a temperature coefficient of the threshold voltage is substantially the same as a temperature coefficient of a resistor of the RC clock circuit, and the reference voltage is used to control the alternating charge or discharge of the at least one capacitor before compensation.

In an embodiment, the voltage generator comprises a current generating unit and a feedback circuit. The current generating unit is configured to generate a compensation current. The feedback circuit receives the reference voltage from the clock circuit and receives the compensation current from the current generating unit, and generates the threshold voltage according to the reference voltage and the compensation current.

In an embodiment, the feedback circuit comprises an operation amplifier and a third resistor. The operation amplifier receives the reference voltage from the clock circuit. The third resistor is coupled to the operation amplifier and receives the compensation current from the current generating unit, where a temperature coefficient of the third resistor is substantially the same as the temperature coefficient of the clock trimming resistor of the clock circuit, and the operation amplifier and the third resistor construct a negative feedback loop and generate the threshold voltage according to the reference voltage and the compensation current.

In an embodiment of the invention, the circuit for generating a clock signal from a clock integrated circuit includes an operation amplifier, a third resistor, a first current source, and a second current source. The third resistor is coupled between a negative input end and the output end of the operation amplifier so as to construct a negative feedback loop on the operation amplifier. The reference voltage is provided to the positive input end of the operation amplifier. If the temperature coefficient of the clock trimming resistor is positive, the first current source provides a current flow from the output end of the operation amplifier through the third resistor to a ground voltage source, and the second current source provides a current flow from a power voltage source through the third resistor to the output end of the operation amplifier, such that the threshold voltage is generated on the output end of the operation amplifier. If the temperature coefficient of the clock trimming resistor is negative, the first current source and the second current source provide a current flow from the power voltage source through the third resistor to the output end of the operation amplifier, such that the threshold voltage is generated on the output end of the operation amplifier.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1A again, if the temperature coefficient of the clock trimming resistor R is TC, $R_O$ is a resistance value of the clock trimming resistor R at a reference temperature (for example, the room temperature 25° C.), and $\Delta t$ is the temperature difference between a temperature and the reference temperature, then the temperature relation of one RC time constant T in formula (2) can be expressed as below:

$$T = C \cdot R = C \cdot R_0 (1 + TC \cdot \Delta t) \tag{3}$$

An example is provided to identify the relationship between the clock period 2T of the RC clock circuit and the temperature as below. For example, a RC clock circuit is proposed to generate a clock period of 30 ns, and the clock trimming resistor R has ±20% resistance variation with positive temperature dependence. After resistance trimming at room temperature (25° C.), the voltage drop $\Delta V$ on the clock trimming resistor R and the clock periods are unified. But temperature dependence of the resistance and the clock periods still exist as shown in Table 1-1 and Table 1-2. Table 1-1 shows a temperature distribution of the clock period in three corner cases and Table 1-2 shows the temperature distribution of the resistance in three corner cases, where R_fast, R_slow and R_typ represent the fast corner, the slow corner and the typical corner of the process of the fabrication respectively. In the case of the temperature at 25° C., the clock periods of the three corners can approximate the target period 30 ns by trimming the resistance of R. However, when the temperature increases to 125° C., the clock periods of the tree corners all drift. The same condition also occurs in the case of the temperature −40° C. The variance of the clock period between 125° C. and −40° C. in the fast corner is 4.36 ns which is 14.72% of the clock period at temperature 25° C. (29.62 ns). The same condition also occurs in the slow corner and the typical corner.

TABLE 1-1

|  |  | Temperature (° C.) |  |  |  |  | Variance |
|---|---|---|---|---|---|---|---|
|  |  | 125 | 85 | 25 | 0 | −40 | (%) |
| Period (ns) | R_fast | 32.59 | 31.28 | 29.62 | 28.82 | 28.23 | 14.72 |
|  | R_slow | 32.23 | 31.58 | 29.28 | 29.27 | 29.25 | 10.18 |
|  | R_typ | 32.22 | 31.4 | 29.82 | 29.33 | 28.33 | 13.04 |

TABLE 1-2

| (1-2) | | | | | | |
|---|---|---|---|---|---|---|
|  |  | Temperature (° C.) | | | | |
|  |  | 125 | 85 | 25 | 0 | −40 |
| Resistance (KΩ) | R_fast | 49.33 | 47.14 | 43.87 | 42.54 | 40.39 |
|  | R_slow | 48.19 | 45.9 | 42.54 | 41.16 | 38.97 |
|  | R_typ | 48.7 | 46.45 | 43.13 | 41.77 | 39.59 |

In order to reduce temperature dependence of a RC clock circuit, a method is provided in embodiments of the invention. Please referring to formula (1) again, R is temperature dependent, if a compensation voltage Vc with substantially the same temperature coefficient TC of the clock trimming resistor R is subtracted from the voltage change on capacitors C1 and C2 while discharging, the first order temperature term of RC time constant can be eliminated as shown below, wherein Vc is $\Delta V \cdot TC \cdot \Delta t$:

$$T(\Delta V/R) = C \cdot (\Delta V - Vc) = C \cdot \Delta V (1 - TC \cdot \Delta t)$$

$$T = R \cdot C(1 - TC \cdot \Delta t)$$
$$= R_0 \cdot C(1 + TC \cdot \Delta t)(1 - TC \cdot \Delta t)$$
$$= R_0 \cdot C\{1 + TC \cdot \Delta t - TC \cdot \Delta t - (TC \cdot \Delta t)^2\}$$
$$= R_0 \cdot C\{1 - (TC \cdot \Delta t)^2\}$$

For the second order temperature term $(TC \cdot \Delta t)^2$ is smaller than the first order temperature term $(TC \cdot \Delta t)$ and can be omitted thereby, thus temperature dependence of the RC time constant is reduced and can be approximated as below.

$$T \approx R_0 \cdot C$$

According to the formula (1), $T(\Delta V/R) = C \cdot \Delta V$, a fixed C with unified T and R implies that $\Delta V$ is also unified after clock trimming. In other words, the required compensation voltage, $Vc = \Delta V \cdot TC \cdot \Delta t$, can be treated as a known value once the design parameters of R, C and TC for a RC clock circuit are determined. If the RC clock circuit has multiple clock periods by changing the resistance value of the RC constant, then the Vc may have multiple values accordingly.

Figure 2:
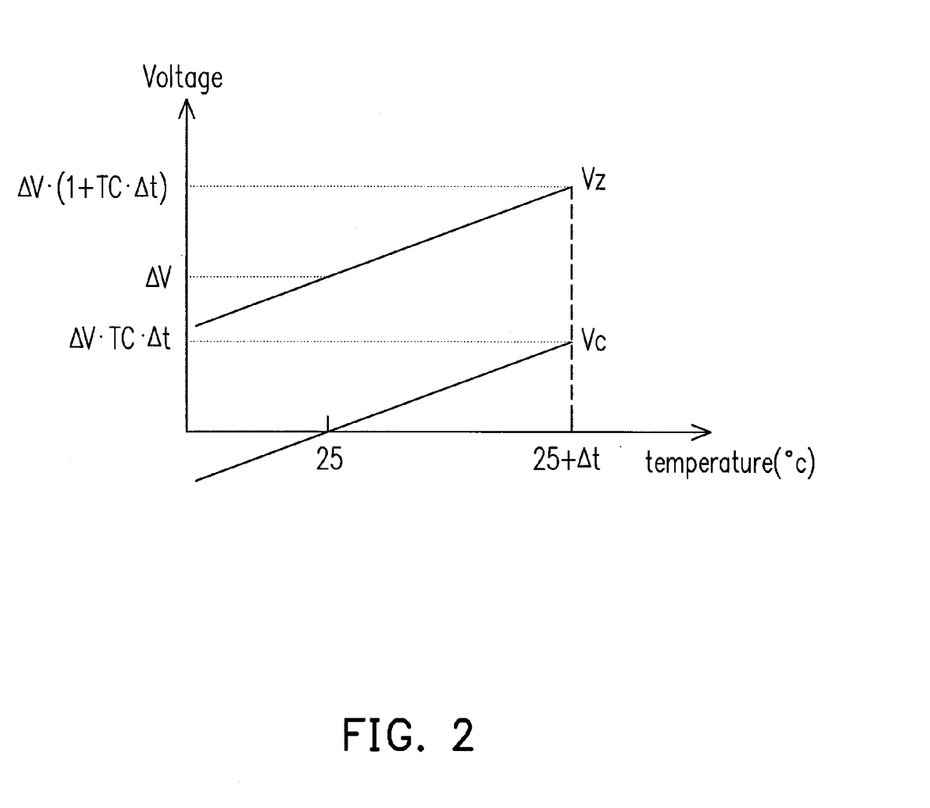
FIG. 2 is a relationship diagram illustrating the relationship between a voltage on a clock trimming resistor, a compensation voltage, a positive temperature coefficient and a temperature, in accordance with an exemplary embodiment of the invention.

FIG. 2 is a relationship diagram illustrating the relationship between a voltage drop $\Delta V$ on the clock trimming resistor, a compensation voltage Vc, a temperature coefficient TC and a temperature. Please referring to FIG. 2, the temperature coefficient TC of FIG. 2 is positive. In other words, the clock trimming resistor R is positive temperature dependent, the resistance value is increased when the temperature increases, and vice versa. In FIG. 2, because $\Delta V$ is determined at the room temperature 25° C. by trimming the clock trimming resistor R so as to obtain a target clock period of the RC clock circuit in three corners, thus the compensation voltage Vc at the room temperature 25° C. is zero. If the temperature is higher than 25° C., the compensation voltage Vc is positive, i.e., the voltage change on capacitors C1 and C2 while discharging is subtracted by Vc. On the other hand, if the temperature is lower than 25° C., the compensation voltage Vc is negative, i.e., the voltage change on capacitors C1 and C2 while discharging is added by Vc. In the embodiment, the room temperature 25° C. is provided as a reference temperature as shown in FIG. 2, but the invention is not limited thereto.

In an embodiment of the invention, the compensation voltage Vc can be embodied by a circuit. As shown in FIG. 2, the formula of Vc may be, for example but not limited to, decomposed as below:

$$Vc = \Delta V \cdot TC \cdot \Delta t = Vz - \Delta V = \Delta V(1 + TC \cdot \Delta t) - \Delta V \quad (4)$$

Regarding the first term of Vc, i.e., Vz or $\Delta V(1 + TC \cdot \Delta t)$, it can be, for example but not limited to, embodied by flowing a zero temperature coefficient current Iz through a third resistor Rc, where the temperature coefficient of the resistor Rc is TC, and the voltage drop on the third resistor Rc is $\Delta V$ at the room temperature. The second term of Vc, $\Delta V$, can be, for example but not limited to, embodied by scaling a bias voltage independent to temperature and a supply voltage of a bandgap circuit. For example, $\Delta V$ is $V_{BG} \cdot (Rc/Rs)$, where $V_{BG}$ is a bias voltage independent to temperature and a supply voltage of the bandgap circuit, Rc is the third resistor, Rs is a fourth resistor with a temperature coefficient of TC. The zero temperature coefficient current Iz mentioned above may also be, for example but not limited to, embodied by a combination of a proportional to absolute temperature (PTAT) current and a complementary to absolute temperature (CTAT) current. The PTAT current may be embodied by the bandgap circuit, for example, $\Delta_{BE}/R1$, where $\Delta V_{BE}$ is a voltage drop between a base and an emitter of a bipolar junction transistor (BJT) of the bandgap circuit, and R1 is a first resistor with a temperature coefficient of TC. The CTAT current may be also embodied by the bandgap circuit, for example, $V_{BG}/R2$, where $V_{BG}$ is the bias voltage independent to temperature and the supply voltage of the bandgap circuit, and R2 is a second resistor with a temperature coefficient of TC. Therefore, the first part of Vc, $\Delta V(1 + TC \cdot \Delta t)$, is proportional to $Rc \cdot (\Delta V_{BE}/R1 + V_{BG}/R2)$.

In summary, Vc can be summarized as below.

$$Vc = \Delta V(1 + TC \cdot \Delta t) - \Delta V \quad (5)$$
$$= Iz \cdot Rc - V_{BG} \cdot (Rc/Rs)$$
$$\approx Rc \cdot (\Delta V_{BE}/R1 + V_{BG}/R2) - V_{BG} \cdot (Rc/Rs)$$

If R1, R2, Rs and Rc all have substantially the same temperature coefficient Tc as that of the clock trimming resistor R, Vc depends on resistor ratios and constant voltages. Thus it is also resistor-corner independent.

Referring to FIG. 1A again, the objective that the compensation voltage Vc is subtracted form the voltage change on capacitors C1 and C2 while discharging is equivalent to the objective that the compensation voltage Vc is added to the reference voltage Vref of the comparators 130 and 140.

Figure 3:
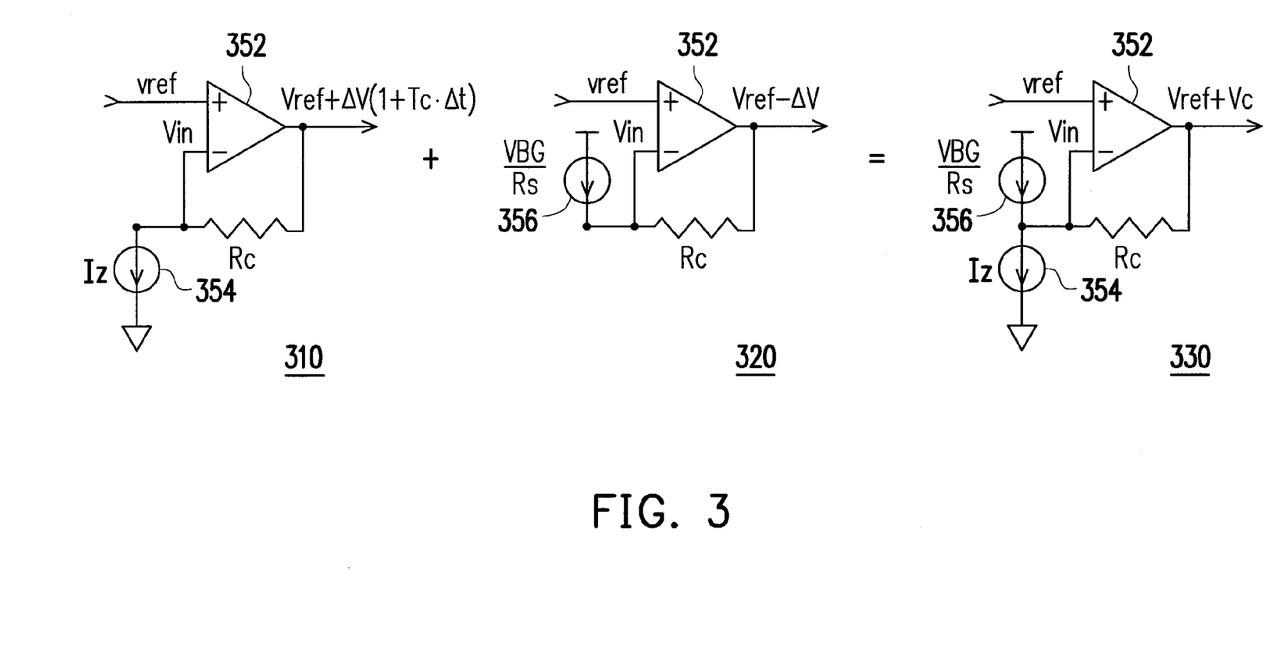
FIG. 3 is a circuit diagram illustrating a step for adding a compensation voltage on a reference voltage by using superposition, in accordance with an exemplary embodiment of the invention.

Please refer to FIG. 3, which schematically illustrates a circuit for generating a compensation voltage Vc to the reference voltage Vref by using superposition in accordance with some exemplary embodiments of the invention. In some embodiments, the circuit is a voltage generator for generating the compensation voltage Vc comprises a current generating circuit and a feedback circuit. The current generating circuit is configured to generate a compensation current. The feedback circuit receives the reference voltage from the RC clock circuit and receives the compensation current from the current generating unit, and generates the threshold voltage according to the reference voltage and the compensation current.

In an embodiment, the feedback circuit comprises an operation amplifier and a third resistor. The operation amplifier receives the reference voltage from the RC clock circuit. The third resistor is coupled to the operation amplifier and receives the compensation current from the current generating unit, where a temperature coefficient of the third resistor is substantially the same as the temperature coefficient of the clock trimming resistor of the RC clock circuit, and the operation amplifier and the third resistor construct a negative feedback loop and generate the threshold voltage according to the reference voltage and the compensation current.

Please refer to FIG. 3, for example, but not limited thereto, in a circuit 310 of FIG. 3, a third resistor Rc is coupled between a negative input end and an output end of an operation amplifier 352, such that the voltages on the negative input end and the positive input end of the operation amplifier 352 can be equalized to Vref by a virtual short circuit effect of the operation amplifier 352, so the voltage Vin is equal to Vref. Besides, a zero temperature coefficient current Iz provided by a first current source 354 flows from the output end of the operation amplifier 352 through the third resistor Rc to the ground, so the voltage drop on the third resistor Rc is Iz·Rc. Thus, the voltage on the output end of the operation amplifier 352 is Vref+Iz·Rc or Vref+$\Delta$V(1+TC·$\Delta$t).

In another embodiment, but not limited thereto, please refer to a circuit 320 of FIG. 3, a current $V_{BG}$/Rs provided by a second current source 356 flows from the power voltage source through a third resistor Rc to an output end of an operation amplifier 352, so the voltage drop on the third resistor Rc is $V_{BG}$·(Rc/Rs). Therefore, the voltage on the output end of the operation amplifier 352 is Vref−$V_{BG}$·(Rc/Rs) or Vref−$\Delta$V.

In further embodiment, but not limited thereto, please refer to a temperature dependence reduction circuit 330 of FIG. 3, it is established by using superposition of the circuit 310 and the circuit 320, such that Vref+Vc can be generated on the output end of the operation amplifier 352.

Figure 4:
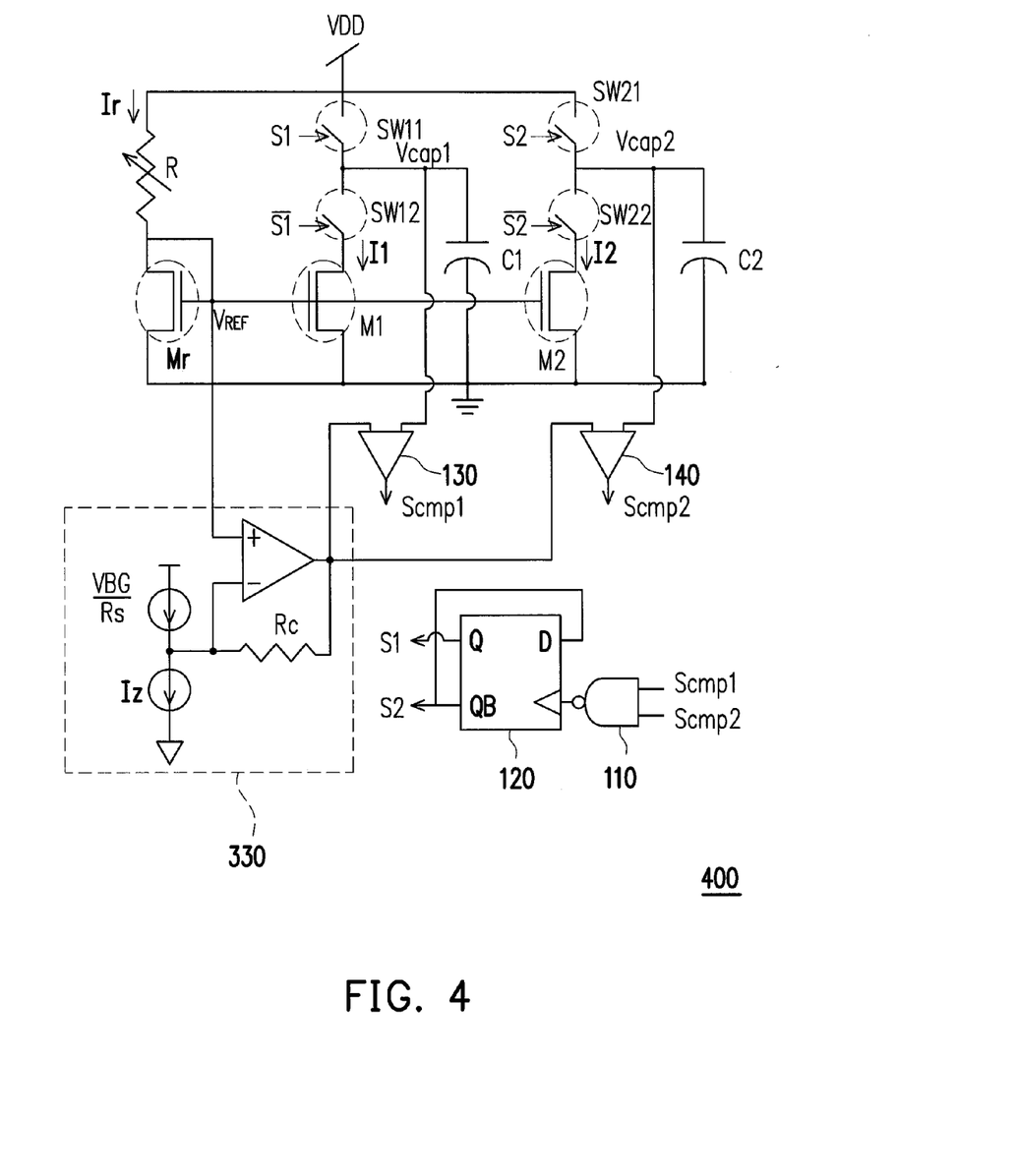
FIG. 4 is a schematic diagram illustrating a temperature dependence reduction circuit used with a RC clock circuit, in accordance with an exemplary embodiment of the invention.

Referring to FIG. 4. FIG. 4 is a schematic diagram illustrating a temperature dependence reduction circuit used with the RC clock circuit, in accordance with an exemplary embodiment of the invention. As shown in FIG. 4, it is the combination of the RC clock circuit 100 of FIG. 1 and the temperature dependence reduction circuit 330 of FIG. 3. The difference between the RC clock circuit 100 of FIG. 1 and the RC clock circuit of FIG. 4 is that the temperature dependence reduction circuit 330 generates the voltage (Vref+Vc) to control the alternating charge or discharge of the capacitors C1 and C2.

Table 2-1 shows the temperature distribution of the compensation voltage Vc in three corner cases according to the circuit of FIG. 4. Table 2-2 shows the temperature distribution of the clock period in three corner cases according to the circuit of FIG. 4. The clock period of the RC clock circuit is still targeted to 30 ns, for example, and the adopted R has ±20% resistance variation with positive temperature dependence, R_fast, R_slow and R_typ represent the fast corner, the slow corner and the typical corner of the process of the fabrication respectively. In the case of the temperature at 25° C., the clock periods of the three corners approximate the target period 30 ns by trimming the resistance of R. When the temperature increases to 125° C., the clock periods of the tree corners still approximate the target period 30 ns. The same condition also occurs in the case of the temperature −40° C. By comparing the clock period in Table 1-1 with that in Table 2-2, it shows that the variance of the clock period between 125° C. and −40° C. in the fast corner is reduced from 14.72% to 3.5%, the variance of the clock period between 125° C. and −40° C. in the slow corner is reduced from 10.18% to 1.65%, and the variance of the clock period between 125° C. and −40° C. in the typical corner is reduced from 13.04% to 2.38%. Based on the above, the method and the circuit provided in the embodiment of the invention can achieve the objective of temperature dependence reduction of the clock period of the RC clock circuit actually.

TABLE 2-1

|  |  | Temperature (° C.) | | | | |
| --- | --- | --- | --- | --- | --- | --- |
|  |  | 125 | 85 | 25 | 0 | −40 |
| Vc (mv) | R_fast | 124.8 | 66.8 | −18.9 | −54.2 | −110.2 |
|  | R_slow | 160 | 100.2 | 11.8 | −24.6 | −82.4 |
|  | R_typ | 146.2 | 87.1 | −0.2 | −36.2 | −93.3 |

TABLE 2-2

|  |  | Temperature (° C.) | | | | | Variance |
| --- | --- | --- | --- | --- | --- | --- | --- |
|  |  | 125 | 85 | 25 | 0 | −40 | (%) |
| Period (ns) | R_fast | 30.1 | 30 | 29.97 | 29.89 | 30.94 | 3.50 |
|  | R_slow | 29.46 | 29.61 | 29.72 | 29.74 | 29.95 | 1.65 |
|  | R_typ | 29.6 | 29.68 | 29.84 | 29.82 | 30.31 | 2.38 |

Although the compensation voltage generating circuit is designed for typical corner case, however, the temperature deviation of the clock period is reduced around 10% after resistance trimming. It demonstrates resistance variation independence of the compensation voltage generating circuit. The RC clock circuit 100 of FIG. 1 is provided as an example in the embodiment, but the invention is not limited thereto. The method and the circuit of the embodiments of the invention can be applied to a RC clock circuit whose clock period is mainly dominated by temperature drift of clock trimming resistor R. Besides, the clock trimming resistor R of the RC clock circuit may be a passive type resistor or an active type resistor, wherein the active type resistor may be an effective resistor formed by a MOS transistor, a FET transistor or a floating gate transistor. Further, the clock trimming resistor R of the RC clock circuit can be resistor-corner independent. Therefore, the method and the circuit of the embodiments of the invention can be used in a memory device, a micro-controller, or a mixed signal System on Chip (SoC) if the corresponding technology doesn't provide low temperature coefficient resistors.

Figure 5:
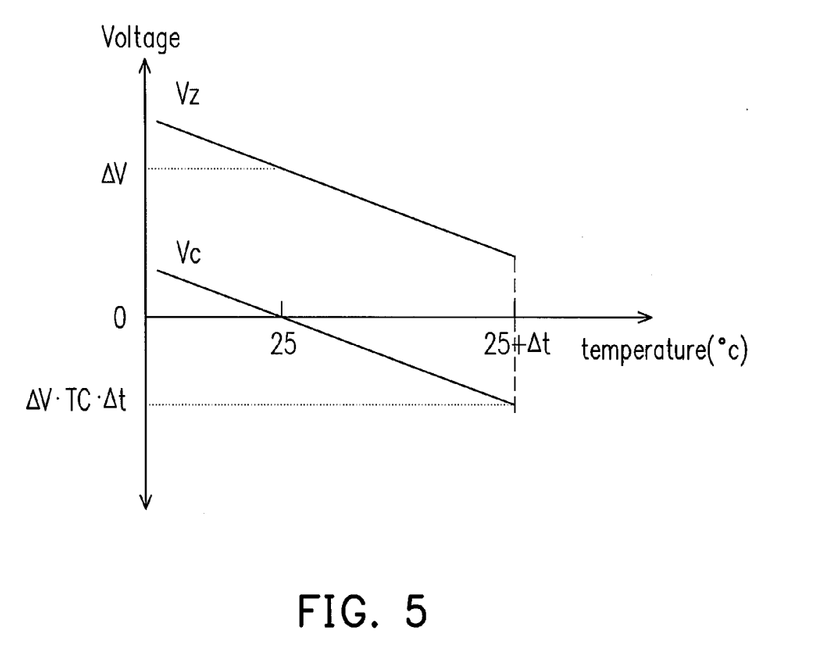
FIG. 5 is another relationship diagram illustrating the relationship between a voltage on a clock trimming resistor, a compensation voltage, a negative temperature coefficient and a temperature, in accordance with an exemplary embodiment of the invention.
Figure 6:
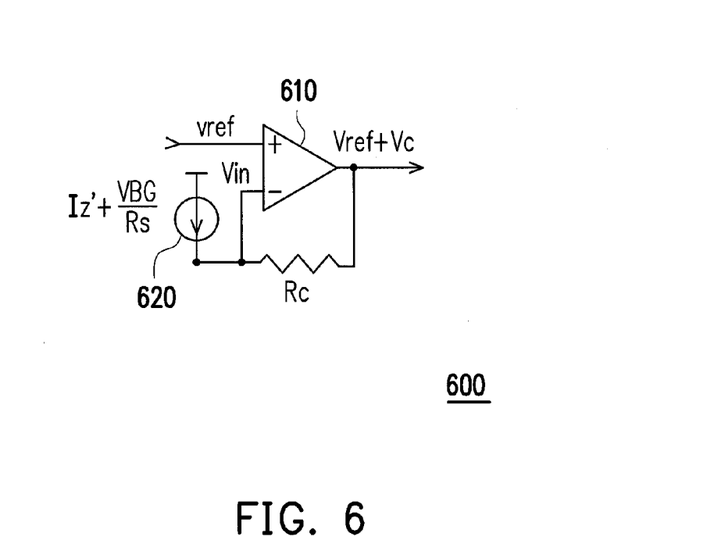
FIG. 6 is another schematic diagram illustrating a temperature dependence reduction circuit, in accordance with an exemplary embodiment of the invention.

Please referring to FIG. 5 and FIG. 6, FIG. 5 is a relationship diagram illustrating the relationship between a voltage on the clock trimming resistor $\Delta V$, a compensation voltage Vc, a negative temperature coefficient TC and a temperature. The relationship shown in FIG. 5 is complementary to that of FIG. 2. If the temperature is higher than 25° C., the compensation voltage Vc is negative, i.e., the voltage change on capacitors C1 and C2 while discharging is added by Vc. On the other hand, if the temperature is lower than 25° C., the compensation voltage Vc is positive, i.e., the voltage change on capacitors C1 and C2 while discharging is subtracted by Vc. The room temperature 25° C. is provided as an example in FIG. 5, but the invention is not limited thereto. FIG. 6 is another schematic diagram illustrating a temperature dependence reduction circuit according to FIG. 5. The compensation voltages Vc generated by the temperature dependence reduction circuit 600 in FIG. 6 and by the temperature dependence reduction circuit 330 in FIG. 3 are complementary to each other, therefore, no relevant details are provided hereinafter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for generating a clock signal from a clock integrated circuit, comprising:
   generating a compensation voltage from a circuit with a resistive element according to a temperature coefficient of a resistor and a clock period of the clock circuit, and the clock period is determined by the resistor and at least one capacitor of the clock integrated circuit,
   wherein the circuit comprises:
   an operation amplifier, receiving a reference voltage from the clock circuit; and
   a third resistor, coupled to the operation amplifier and receiving a compensation current from a current generating unit, wherein a temperature coefficient of the third resistor is substantially the same as the temperature coefficient of the resistor of the clock circuit.

2. The method for generating a clock signal from a clock integrated circuit according to claim 1, wherein the operation of generating the compensation voltage comprises:
   generating the compensation voltage Vc=$\Delta V \cdot TC \cdot \Delta t = \Delta V(1+TC \cdot \Delta t) - \Delta V$,
   wherein $\Delta V$ is a voltage drop on the resistor based on a reference temperature, TC is the temperature coefficient of the resistor, and $\Delta t$ is a temperature difference between a first temperature and the reference temperature.

3. The method for generating a clock signal from a clock integrated circuit according to claim 2, wherein
   the first term of the compensation voltage $\Delta V(1+TC \cdot \Delta t)$ is obtained by flowing a first current through the third resistor, and
   the second term of the compensation voltage $\Delta V$ is obtained by scaling a bias voltage independent to temperature and a supply voltage of a bandgap circuit,
   wherein the temperature coefficient of the third resistor is TC, a temperature coefficient of the first current is zero, and the first current is a combination of a proportional to absolute temperature (PTAT) current and a complementary to absolute temperature (CTAT) current.

4. The method for generating a clock signal from a clock integrated circuit according to claim 3, wherein
   the second term of the compensation voltage $\Delta V$ is $V_{BG} \cdot (Rc/Rs)$,
   the PTAT current is $\Delta V_{BE}/R1$, and
   the CTAT current is $V_{BG}/R2$,
   wherein $V_{BG}$ is the bias voltage independent to temperature and a supply voltage of the bandgap circuit, Rc is the third resistor, Rs is a fourth resistor, $\Delta V_{BE}$ is a voltage drop between a base and an emitter of a bipolar junction transistor (BJT) of the bandgap circuit, R1 is a first resistor, R2 is a second resistor, and temperature coefficients of the first resistor, the second resistor, the third resistor and the fourth resistor are TC.

5. The method for generating a clock signal from a clock integrated circuit according to claim 1, further comprising
   compensating a voltage change on the at least one capacitor of the clock circuit according to the compensation voltage when the at least one capacitor discharging.

6. The method for generating a clock signal from a clock integrated circuit according to claim 5, wherein the operations of compensating the voltage change on the at least one capacitor of the clock circuit comprises:
   subtracting the compensation voltage from the voltage change on the at least one capacitor when the at least one capacitor discharging; or
   generating a voltage by adding the compensation voltage with the reference voltage, wherein the voltage is used to control the alternating charge or discharge of the at least one capacitor after compensation, and the reference voltage is used to control the alternating charge or discharge of the at least one capacitor before compensation.

7. The method for generating a clock signal from a clock integrated circuit according to claim 6, wherein the steps of generating the voltage comprise:
   providing the reference voltage to a positive input end of the operation amplifier;
   coupling the third resistor between a negative input end and an output end of the operation amplifier;
   if the temperature coefficient of the resistor being positive,
   providing a first current source flowing from the output end of the operation amplifier through the third resistor to a ground voltage source, and
   providing a second current source flowing from a power voltage source through the third resistor to the output end of the operation amplifier, and
   if the temperature coefficient of the resistor being negative,
   providing the first current source and the second current source flowing from the power voltage source through the third resistor to the output end of the operation amplifier; and
   generating the voltage on the output end of the operation amplifier,
   wherein a temperature coefficient of the first current source is zero, the second current source is generated according to a bias voltage independent to temperature and a supply voltage of a bandgap circuit and a fourth resistor, and temperature coefficients of the third resistor and the fourth resistor are substantially the same as the temperature coefficient of the resistor.

8. The method for generating a clock signal from a clock integrated circuit according to claim 1, wherein the resistor of the clock circuit is a passive type resistor or an active type resistor, wherein the active type resistor is an effective resistor formed by a MOS transistor, a FET transistor or a floating gate transistor.

9. The method for generating a clock signal from a clock integrated circuit according to claim 1, the resistor of the clock circuit is resistor-corner independent.

10. The method for generating a clock signal from a clock integrated circuit according to claim 1 is used in a memory device, a micro-controller, or a mixed signal System on Chip (SoC) if the corresponding technology doesn't provide a low temperature coefficient resistor.

11. The method for generating a clock signal from a clock integrated circuit according to claim 1, wherein the resistor is a clock trimming resistor.

12. A circuit for generating a clock signal from a clock integrated circuit, comprising:
a voltage generator, receiving a reference voltage from a clock circuit, and having a resistive element for generating a voltage,
wherein the voltage generator comprises:
an operation amplifier, receiving the reference voltage from the clock circuit; and
a third resistor, coupled to the operation amplifier and receiving a compensation current from a current generating unit, wherein a temperature coefficient of the third resistor is substantially the same as a temperature coefficient of a resistor of the clock circuit.

13. The circuit for generating a clock signal from a clock integrated circuit according to claim 12, wherein the voltage generator comprises:
the current generating unit, configured to generate the compensation current; and
a feedback circuit, receiving the reference voltage from the clock circuit, receiving the compensation current from the current generating unit, and generating the voltage according to the reference voltage and the compensation current.

14. The circuit for generating a clock signal from a clock integrated circuit according to claim 13,
wherein the operation amplifier and the third resistor construct a negative feedback loop and generate the voltage according to the reference voltage and the compensation current.

15. The circuit for generating a clock signal from a clock integrated circuit according to claim 13, wherein the current generating unit comprises:
a first current source, including a first end and a second end, wherein the first end is coupled to the feedback circuit, the second end is coupled to a ground voltage source, and a temperature coefficient of the first current source is zero; and
a second current source, including a first end and a second end, wherein the first end is coupled to a power voltage source, the second end is coupled to the feedback circuit, and the second current source is a second complementary to absolute temperature (CTAT) current source.

16. The circuit for generating a clock signal from a clock integrated circuit according to claim 15, wherein
the first current source is generated by a proportional to absolute temperature (PTAT) current source and a first complementary to absolute temperature (CTAT) current source, and
the second current source is generated according to a bias voltage independent to temperature and a supply voltage of a bandgap circuit and a fourth resistor, wherein a temperature coefficient of the fourth resistor is substantially the same as the temperature coefficient of the resistor of the clock circuit.

17. The circuit for generating a clock signal from a clock integrated circuit according to claim 16, wherein
the PTAT current source is generated according to a voltage drop between a base and an emitter of a bipolar junction transistor (BJT) of the bandgap circuit and a first resistor, and
the first CTAT current source is generated according to the bias voltage independent to temperature and the supply voltage of the bandgap circuit and a second resistor,
wherein temperature coefficients of the first resistor and the second resistor are substantially the same as the temperature coefficient of the resistor of the clock circuit.

18. The circuit for generating a clock signal from a clock integrated circuit according to claim 13, wherein the current generating unit comprises:
a first current source, including a first end and a second end, wherein the first end is coupled to a power voltage source, the second end is coupled to the feedback circuit, and a temperature coefficient current of the first current source is zero; and
a second current source, including a first end and a second end, wherein the first end is coupled to the power voltage source, the second end is coupled to the feedback circuit, and the second current source is a second complementary to absolute temperature (CTAT) current source.

19. The circuit for generating a clock signal from a clock integrated circuit according to claim 12, the resistor of the clock circuit is a passive type resistor or an active type resistor, wherein the active type resistor is an effective resistor formed by a MOS transistor, a FET transistor or a floating gate transistor.

20. The circuit for generating a clock signal from a clock integrated circuit according to claim 12, wherein the resistor of the clock circuit is resistor-corner independent.

* * * * *